United States Patent [19]

Kobayashi et al.

[11] 4,376,251

[45] Mar. 8, 1983

[54] WAVEFORM SHAPING CIRCUIT

[75] Inventors: Kazuyuki Kobayashi; Tsutomu Kakuya, both of Kawasaki, Japan

[73] Assignee: Fujitsu Limited, Kawasaki, Japan

[21] Appl. No.: 333,654

[22] Filed: Dec. 23, 1981

Related U.S. Application Data

[63] Continuation of Ser. No. 72,459, Sep. 5, 1979, abandoned.

[30] Foreign Application Priority Data

Sep. 8, 1978 [JP] Japan .................... 53-123592[U]

[51] Int. Cl.³ .................. H03K 5/153; H03K 3/295
[52] U.S. Cl. ............................. 307/268; 307/290; 307/359
[58] Field of Search .............. 307/290, 359, 261, 268, 307/362, 363, 304

[56] References Cited

U.S. PATENT DOCUMENTS 3,529,184 9/1970 Conklin .................. 307/290

Primary Examiner—John Zazworsky
Attorney, Agent, or Firm—Staas & Halsey

[57] ABSTRACT

A waveform shaping circuit which shapes an input signal into an output signal having a rectangular waveform. The waveform shaping circuit according to the present invention includes a first MOS transistor having a first terminal to which said input signal is applied, a second MOS transistor having an second terminal for supplying an output signal and a third terminal connected to ground an impedance element which is connected between a second terminal of said first MOS transistor and a first terminal of said second MOS transistor, a reference voltage source which is connected between a third terminal of said first MOS transistor and ground, and a third MOS transistor having a second terminal which is connected to the third terminal of said first MOS transistor and a first terminal which is connected to the second terminal of said second MOS transistor and a third terminal which is connected to ground.

6 Claims, 11 Drawing Figures

WAVEFORM SHAPING CIRCUIT

This is a continuation of application Ser. No. 072,459 filed Sept. 5, 1979 now abandoned.

FIELD OF THE INVENTION

The present invention relates to a waveform shaping circuit which has hysteresis loop characteristics and which is operated as a Schmitt trigger circuit. Specifically, the present invention relates to a waveform shaping circuit having a high input impedance and a low output impedance.

DESCRIPTION OF THE PRIOR ART

At present, waveform shaping circuits, such as Schmitt trigger circuits, are widely used for converting input signals into output signals having rectangular waveforms, particularly in the digital technology field.

Specifically, in widely used apparatus, input signals including various noise signals or distorted signals should be shaped so that the apparatus operates without malfunctioning. The waveform shaping circuits which are used in such apparatus are required to have a high input impedance and a low output impedance, and a further requirement is that the hysteresis loop characteristics of the waveform shaping circuit can be easily determined. However, in the conventional waveform shaping circuit, when a large hysteresis loop is used, it is required that resistors having a low value be used in the waveform shaping circuit. Therefore, the waveform shaping circuit which has a high input impedance, a low output impedance and a large hysteresis loop can not be obtained.

OBJECTS AND SUMMARY OF THE INVENTION

An object of the present invention is to provide a waveform shaping circuit which has a high input impedance, a low output impedance and a large hysteresis loop as the input-output characteristics.

Another object of the present invention is to provide a waveform shaping circuit which has a high input impedance and a low output impedance, and also, which has hysteresis loop characteristics which can be easily changed.

A further object of the present invention is to provide a waveform shaping circuit which has a high input impedance and a low output impedance, and also, which has a large hysteresis loop so that the characteristics of the waveform shaping circuit are not affected by noise. A still further object of the present invention is to provide a waveform shaping circuit which has a high input impedance, a low output impedance and a large hysteresis loop, and also, which is suitable for being manufactured as an LSI circuit (large scale integrated circuit).

The above-mentioned objects can be achieved by the waveform shaping circuit which shapes an input signal into an output signal having a rectangular waveform, comprising a first MOS transistor having a first terminal to which said input signal is applied, a second MOS transistor having a second terminal for supplying an output signal, an impedance element which is connected between a second terminal of said first MOS transistor and a first terminal of said second MOS transistor, a reference voltage source which is connected between a third terminal of said first MOS transistor and ground, and a third MOS transistor having a second terminal which is connected to the third terminal of said first MOS transistor and a first terminal which is connected to the second terminal of said second MOS transistor. The first terminal of each MOS transistor corresponds to a gate electrode, the second terminal of each MOS transistor corresponds to a drain (or a source) and the third terminal of each MOS transistor corresponds to a source (or a drain).

Further features and advantages of the present invention will be apparent from the ensuing description with reference to the accompanying drawings to which, however, the scope of the invention is in no way limited.

DETAILED DESCRIPTION OF THE INVENTION

Figure 1:
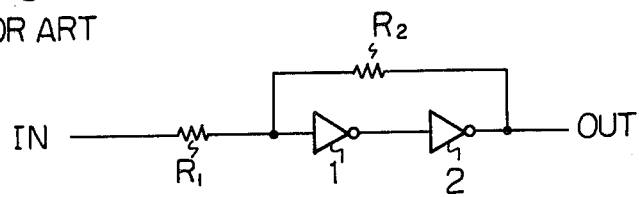
FIG. 1 is a block diagram of a conventional waveform shaping circuit.

FIG. 1 illustrates a conventional waveform shaping circuit. The circuit illustrated in FIG. 1 is also called a Schmitt trigger circuit, and this circuit comprises inverters 1, 2, a resistor $R_1$ and a feedback resistor $R_2$. This circuit illustrated in FIG. 1 is widely used because the construction of the circuit is simple. However, in this circuit the input impedance is determined by the values of the resistors $R_1$ and $R_2$, and the hysteresis loop is determined by the ratio of $R_2/R_1$. Therefore, if a large hysteresis loop is required in the circuit illustrated in FIG. 1, it is very difficult to form a high input impedance circuit.

Figure 2:
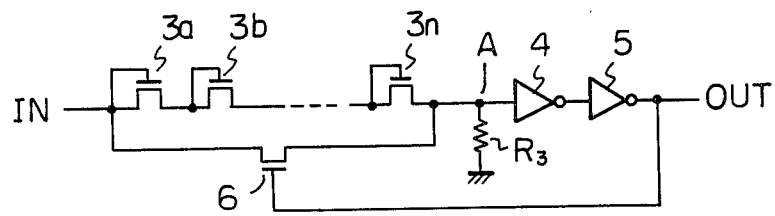
FIG. 2 is a block diagram of another conventional waveform shaping circuit which improves the circuit shown in FIG. 1.

For the purpose of obtaining a waveform shaping circuit having a high input impedance and large hysteresis loop characteristics, the circuit illustrated in FIG. 2 is conventionally used. The circuit illustrated in FIG. 2 comprises reference voltage source units $3a$, $3b$, ... $3n$, which are connected in series, inverters 4, 5, an MOS transistor 6 which is connected to a feedback circuit from the output of the inverter 5 and a resistor $R_3$ which is connected between the input of the inverter 4 and ground. In the circuit formed as illustrated in FIG. 2, when the voltage of the reference voltage source is increased by increasing the number of the reference voltage source units, and the resistance value of the resistor $R_3$ is increased, a circuit having a high input impedance and large hysteresis loop characteristics can be obtained. However, the resistor $R_3$ is used for discharging electric charges stored at a point A when the transistor is placed in an off state and, therefore, when a high resistance value is used for the resistor $R_3$, this circuit can not be used for high speed operation. This is because the time constant of the circuit increases, so that this circuit can not be operated when a rapid pulse is applied to the input terminal. When a low resistance value is used as the resistor $R_3$ so that the circuit can be operated by a rapid input pulse, the input impedance of the circuit decreases, so that the high input impedance requirement for the circuit can not be satisfied.

Figure 3:
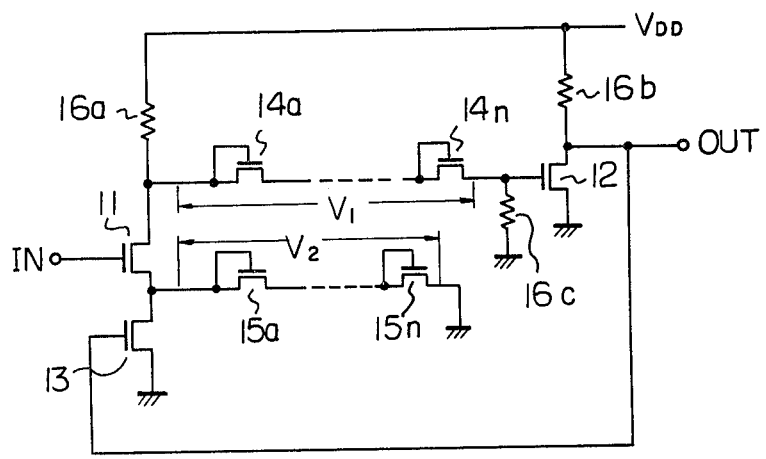
FIG. 3 illustrates a circuit of one embodiment of a waveform shaping circuit according to the present invention.
Figures 4A, 4B, 4C:
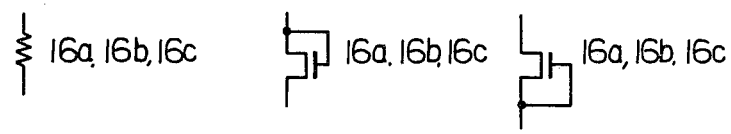
FIGS. 4A, 4B and 4C illustrate resistances used in the circuit shown in FIG. 3.

FIG. 3 illustrates a circuit of one embodiment of the waveform shaping circuit according to the present invention. Referring to FIG. 3, the circuit according to the present invention comprises a first MOS transistor 11 having a gate which forms an input terminal for receiving an input signal, a second MOS transistor 12 having a drain which forms an output terminal and a source which is connected to ground, impedance elements 14a, ... 14n which are connected between a drain of the first MOS transistor 11 and a gate of the second MOS transistor 12, reference voltage source units 15a, ... 15n which are connected between a source of the first MOS transistor 11 and ground, a third MOS transistor 13 having a drain which is connected to the source of the first MOS transistor 11 and a gate which is connected to the drain of the second MOS transistor 12, load resistors 16a and 16b for the first and the second MOS transistors 11 and 12, respectively, and a resistor 16c which is connected between the gate of the second MOS transistor 12 and ground. Referring to the circuit illustrated in FIG. 3, reference voltage source units 15a, ... 15n are formed by MOS transistors each having a gate which is connected to a source or a drain thereof as illustrated in FIG. 3. These MOS transistors 15a, ... 15n can be used as Zener diodes. Further, usual resistors may be used as the reference source units 16a, 16b and 16c. However, when the circuit is formed as an integrated circuit, the resistors 16a, 16b and 16c are formed by enhancement type MOS transistors or depletion type MOS transistors each having a gate which is connected to a source or a drain thereof, as illustrated in FIGS. 4A, 4B and 4C. In addition, the impedance elements have a level conversion function, and MOS transistors each having a gate which is connected to a source or a drain thereof can be used as the impedance elements, and also, a combination of usual resistors may be used as the impedance elements.

Referring again to the circuit illustrated in FIG. 3, according to the present invention, the second MOS transistor 12 is biased so as to be placed in an ON state when no signal is applied to the gate of the first MOS transistor 11. That is, when no signal is supplied to the gate of the first MOS transistor 11, an input voltage $[V_{DD}-V_1]$ (wherein $V_{DD}$ is a source voltage, and $V_1$ is a level shift voltage due to the impedance elements 14a, ... 14n) is supplied to the gate of the MOS transistor 12, and this input voltage is selected so that it is larger than a gate threshold voltage of the second MOS transistor 12.

The impedance elements 14a, ... 14n are formed, as already mentioned, for example, by MOS transistors each having gate which is connected to a drain or a source thereof, and a desired value of the voltage $nV_{THB}$ (wherein $V_{THB}$ is the threshold voltage of each of the MOS transistors 14a, 14b, ... 14n) can be obtained as the level shift voltage $V_1$ by changing the number of MOS transistors. The resistor 16c is used for discharging the electric charges stored in the gate portion of the second MOS transistor 12 when the second MOS transistor is placed in an OFF state.

When no signal is supplied to the gate of the first MOS transistor 11, the first MOS transistor 11 is placed in an OFF state and the third MOS transistor 13, having its gate connected to the drain (the output terminal) of the second MOS transistor 12, is kept in an OFF state, because, the drain of the second MOS transistor 12 is placed in a low potential state. Therefore, a ground voltage "0" is obtained at the output terminal OUT.

Figure 5A:
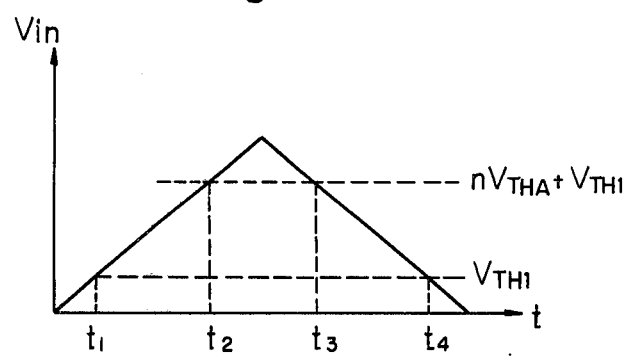
FIGS. 5A and 5B illustrate an input waveform and an output waveform in the circuit illustrated in FIG. 3.

In the above mentioned state, an input signal, such as illustrated in FIG. 5A, is applied to the gate of the first MOS transistor 11 (the input terminal IN). At the time $t_1$ even if the potential of the input signal is larger than the threshold voltage $V_{THI}$ of the first MOS transistor 11, the first MOS transistor can not be placed to an ON state because a sufficient potential difference for placing the first MOS transistor 11 in the ON state can not be obtained between the source and the gate of the first MOS transistor 11 due to the voltage $V_2$ formed by the sum of the voltages $V_{THA}$ of the reference voltage source units 15a, ... 15n. Similar to the impedance elements 14a, ... 14n, the reference voltage source units 15a, ... 15n are formed by MOS transistors each having a gate which is connected to a drain or a source thereof. When it is assumed that the threshold voltage of one MOS transistor is $V_{THA}$, the threshold voltage $V_2$ which is formed by the reference voltage source units 15a, ... 15n is $nV_{THA}$ (wherein "n" is the number of the reference voltage source units). Therefore, when the input voltage becomes larger than the voltage $[V_{THI}+nV_{THA}]$ at a time $t_2$, the first MOS transistor 11 is placed in an ON state.

When the first MOS transistor 11 is placed in the ON state, the potential on the drain of the first MOS transistor 11 becomes nearly equal to $nV_{THA}$, and the potential in the gate of the second transistor 12 becomes equal to $[nV_{THA}-nV_{THB}]$, that is, the potential which is obtained by substracting the voltage drop in the impedance elements from the reference voltage source voltage. When the numbers of the MOS transistors which are used as the impedance elements and the reference voltage source units are selected so that the second MOS transistor 12 is placed in the OFF state when the voltage of the gate of the second transistor 12 becomes $[nV_{THA}-nV_{THB}]$, an output voltage which is equal to the source voltage $V_{DD}$ can be obtained at the output terminal OUT. Actually, the voltage which is obtained by subtracting the voltage drop in the resistor 16b from the source voltage $V_{DD}$ is obtained at the output terminal OUT.

When the output voltage is generated at the output terminal OUT, the third MOS transistor 13 is placed in an ON state, so that the potential at the drain of the first MOS transistor 11 drops, and the second MOS transistor 12 kept in the OFF state. The OFF state of the second MOS transistor 12 is maintained even if the input voltage becomes lower than the sum of the threshold voltage $V_{THI}$ of the first MOS transistor 11 and the reference voltage source $nV_{THA}$, that is, $[V_{THI}+nV_{THA}]$ at the time $t_3$ in FIG. 5A.

That is, when the output voltage is generated from the output terminal, the third MOS transistor 13 is placed in the ON state and the source potential of the first MOS transistor 11 is nearly equal to zero. Therefore, when the input voltage becomes lower than the threshold voltage $V_{THI}$ of the first MOS transistor at the time t4, the first MOS transistor 11 is placed in the off state.

Figure 5B:
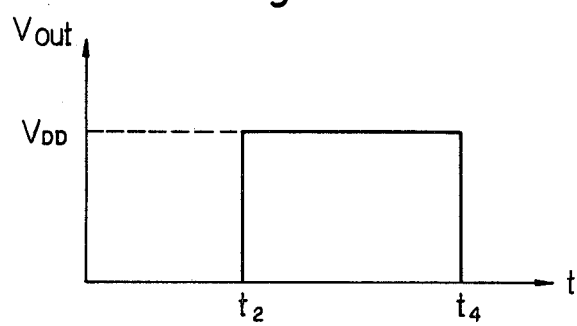

When the first MOS transistor 11 is placed in the off state, the potential of the gate of the second MOS transistor 12 becomes [$V_{DD}-V_1$], which is the same as when no signal is supplied to the input terminal and the second MOS transistor 12 is placed in the ON state. Therefore, the third MOS transistor 13 is placed in the OFF state, so that the circuit is placed in the initial state. FIG. 5B illustrates a waveform of the output voltage.

Figure 6A:
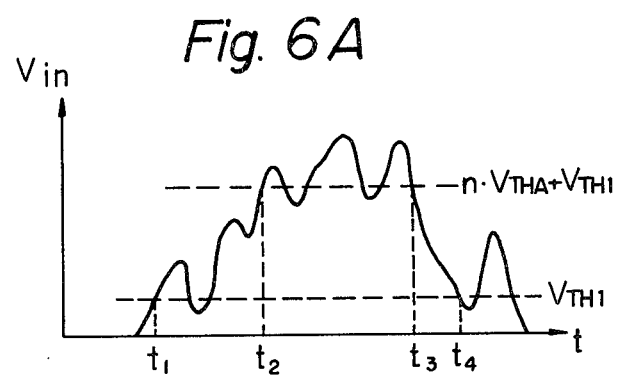
FIGS. 6A and 6B illustrate another input waveform and another output waveform in the circuit illustrated in FIG. 3.
Figure 6B:
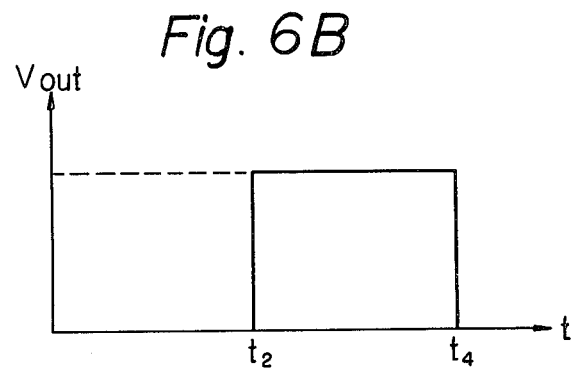

FIG. 6A illustrates a waveform of a distorted input signal and FIG. 6B illustrates an output waveform corresponding to the distorted input signal illustrated in FIG. 6A. According to the present invention, even if the input signal has the distortion illustrated in FIG. 6A, a output signal having a pure rectangular waveform, as illustrated in FIG. 6B, can be obtained. That is, when the second MOS transistor 12 is kept in the ON state, the first MOS transistor 11 is biased by the reference voltage source units 15a through 15n, so that the threshold voltage of the first MOS transistor 11 rises, and when the second MOS transistor 12 is placed in the OFF state, the bias voltage applied to the first transistor 11 is released by the third MOS transistor 13, so that the threshold voltage of the first MOS transistor falls.

In the present invention, the first MOS transistor 11 is used as the input stage and the gate of the first MOS transistor 11 is used as the input terminal, and therefore, the input impedance of the circuit is infinitely high. Further, the resistor 16c, which is connected via the impedance elements to the drain of the MOS transistor 11, is separated from the input circuit, so that the resistance value of the resistor 16c is independent of the input impedance. Therefore, the value of the resistor 16c is determined by selecting the ratio of the resistances of the resistors 16a:16c in such a manner that a voltage larger than the threshold voltage of the second MOS transistor 12 is supplied to the gate of said second MOS transistor 12. A small value, for example, smaller than several [kΩ] can be selected as the resistance value of the resistor 16c, so that the electric charges stored in the gate portion of the second MOS transistor 12 can be discharged rapidly.

Further, in the present invention, the second MOS transistor 12 is used as the output stage and, therefore, the value of the resistance 16b which forms an inverter with the second transistor 12 can be freely selected in accordance with the characteristics of the next stage circuit (not shown in FIG. 3) which is connected to the output terminal of the inverter. Therefore, the output impedance of the waveform shaping circuit can be decreased by appropriately selecting the value of the resistance 16b.

Figure 7:
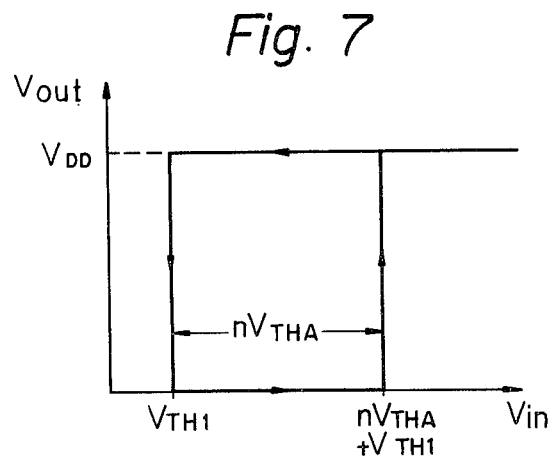
FIG. 7 illustrates an input-output characteristic, that is, the hysteresis loop characteristic, in the circuit illustrated in FIG. 3.

The input-output characteristics of the circuit according to the present invention are illustrated in FIG. 7. As will be understood from FIG. 7, the hysteresis loop voltage is $nV_{THA}$, and this hysteresis loop voltage can be determined by appropriately selecting the number of MOS transistors. Therefore, the hysteresis loop voltage can be freely changed and logically determined. As a result, the waveform shaping circuit according to the present invention can be easily formed in a large scale integrated circuit, and the circuit according to the present invention can be formed by using only MOS transistors. Consequently, the circuit according to the present invention can be easily manufactured.

The number of the MOS transistors used as the impedance elements having the level shift function can be determined based on the voltage by which the second MOS transistor 12 can be placed in the OFF state when the first MOS transistor 11 is placed in the ON state. That is, the number of MOS transistors $14_a, \ldots 14_n$ is determined so that the potential of the MOS transistors is the same as the reference voltage source level. When the dimensions of the MOS transistors used as the impedance elements are the same as those of the MOS transistors used as the reference voltage sources, the number of MOS transistors used as the impedance elements $14a, \ldots 14n$ may be the same as the number of the MOS transistors used as the reference voltage source units $15a \ldots 15n$.

As mentioned above, according to the present invention, there is provided a waveform shaping circuit which has a high input impedance and a low output impedance and which is not affected by noise. Further, in the circuit according to the present invention, the hysteresis loop characteristic of the circuit can be freely determined or changed, and the circuit according to the present invention is suitable for being manufactured as a large scale integrated circuit.

What is claimed is:

1. A waveform shaping circuit which shapes an input signal into an output signal having a rectangular waveform, comprising:
   first, second and third MOS transistors respectively having first, second and third terminals;
   first and second resistance elements connected between said first terminals of said first and second MOS transistors, respectively, and a supply voltage terminal;
   said second terminal of said first MOS transistor being connected to an input terminal of said circuit for receiving the input signal and said third terminal thereof being connected to said first terminal of said third MOS transistor;
   said third terminal of said third MOS transistor being connected to ground;
   said first terminal of said second MOS transistor being connected to an output terminal for supplying the output signal of said circuit and further being connected to said second terminal of said third MOS transistor to provide a feedback signal thereto;
   impedance means connected between said first terminal of said first MOS transistor and said second terminal of said second MOS transistor and comprising a first plurality of series-connected MOS transistors, each said MOS transistor of said first plurality having a shorted connection between said first and second terminals thereof;
   resistance means connected between said second terminal of said second MOS transistor and ground; and
   reference voltage source means connected between the common connection of said third terminal of said first MOS transistor and said first terminal of said third MOS transistor and ground and comprising a second plurality of series-connected MOS transistors, each thereof having a shorted connection between said first and third terminals thereof.

2. A waveforms shaping circuit as recited in claim 1 wherein:
   series-connected MOS transistors of said first plurality comprising said impedance means are of a common type and dimension, and define a level shift voltage $V_1 = nV_{THB}$ wherein "n" corresponds to the number of said series-connected MOS transistors and $V_{THB}$ represents the threshold voltage of each of said MOS transistors of said first plurality thereof, and said second plurality of said MOS transistors comprising said reference voltage source means defines a reference voltage $V_2 = nV_{THA}$ where "n" is the number of said MOS transistors and $V_{THA}$ represents the threshold voltage of each of said MOS transistors of said second plurality thereof.

3. A waveform shaping circuit as recited in claim 2 wherein said first and second terminals of each of said MOS transistors of said first and second pluralities thereof comprise the source and gate terminals, respectively, of each thereof.

4. A waveform shaping circuit as recited in claim 2 wherein said first and second terminals of each of said MOS transistors of said first and second pluralities thereof comprise the drain and gate terminals, respectively, of each thereof.

5. A waveform shaping circuit as recited in claim 1 wherein:

each of said MOS transistors of said first and second pluralities thereof is of the same individual dimensions, and the number "n" of said MOS transistors of each of said first and second pluralities thereof is the same.

6. A waveform shaping circuit as recited in any of the claims 1, 2, 3, 4 or 5 wherein each of said first and second resistance elements comprises a MOS field effect transistor.

* * * * *

UNITED STATES PATENT AND TRADEMARK OFFICE
CERTIFICATE OF CORRECTION

PATENT NO. : 4,376,251

DATED : March 8, 1983

INVENTOR(S) : Kabayashi et al.

It is certified that error appears in the above-identified patent and that said Letters Patent is hereby corrected as shown below:

```
Front page, [57] ABSTRACT, line 6, "an" should be --a--;
            [57] ABSTRACT, line 8, after "ground" insert --,--.
Column 1, line 52, begin a new paragraph with "A still";
          line 63, "an" (first occurrence) should be --a--.
Column 2, line 31, "3, and;" should be --3; and--.
Column 3, line 62, after "having" insert --a--.
Column 5, line 16, "a" (first occrrence) should be --an--;
          line 46, "resistance" should be --resistor--;
          line 53, "tance" should be --tor--.
```

Signed and Sealed this

Eleventh Day of October 1983

[SEAL]

Attest:

GERALD J. MOSSINGHOFF

Attesting Officer

Commissioner of Patents and Trademarks